United States Patent [19]

Kasahara

[11] Patent Number: 4,954,850
[45] Date of Patent: Sep. 4, 1990

[54] VARIABLE-CAPACITANCE DIODE DEVICE

[75] Inventor: Takeshi Kasahara, Saitama, Japan

[73] Assignee: Toko, Inc., Tokyo, Japan

[21] Appl. No.: 231,714

[22] Filed: Aug. 12, 1988

[30] Foreign Application Priority Data

Aug. 25, 1987 [JP] Japan .................................. 62-210852

[51] Int. Cl.⁵ .......................................... H01L 29/93
[52] U.S. Cl. ........................................ 357/14; 357/89;
357/90
[58] Field of Search .............................. 357/14, 89, 90

[56] References Cited

U.S. PATENT DOCUMENTS 3,483,443 12/1969 Mayer ..................................... 357/14
3,634,738 1/1972 Leith et al. ............................. 357/14
4,438,445 3/1984 Colguhoun et al. .................... 357/14

FOREIGN PATENT DOCUMENTS 53-13370 2/1978 Japan ...................................... 357/14
61-81674 4/1986 Japan ...................................... 357/14

Primary Examiner—William D. Larkins

[57] ABSTRACT

In a variable-capacitance diode device consisting of a PN junction, and a semiconductor layer of a first conductivity type, the impurity concentration of which decreases as the depth from the PN junction increases, the semiconductor layer of the first conductivity type is arranged to include, except in the vicinity of the PN junction, at least one such point that the following relationship holds true:

$$A_i \leqq A_{i+1} \ (i=1, 2, \ldots, n)$$

where $A_i$ represents impurity concentration of said semiconductor layer of the first conductivity type at a distance $X_i$ as viewed depth-wise of the PN junction.

1 Claim, 3 Drawing Sheets

VARIABLE-CAPACITANCE DIODE DEVICE

BACKGROUND OF THE INVENTION

1. Field of the Invention:

This invention relates to a variable capacitance diode device suited to tuning with an electronic tuning circuit.

2. Description of the Prior Art:

Variable-capacitance diode devices have recently found extensive use as tuning elements for electronic tuning circuit. There have conventionally been demands for variable-capacitance diode devices with a wide voltage range. With a variable-capacitance diode device, as the potential difference across the junction thereof increases with a reverse bias voltage (referred to as applied voltage hereinafter), the width of depletion layer tends to expand with a distribution of impurity concentration in the semiconductor layer. To achieve a variable-capacitance diode device with a wide voltage range, it has been the usual practice that the impurity concentration in that region of the semiconductor layer where the depletion layer tends to expand, is controlled so as to be proximate to the Gaussian distribution, i.e., so as to decrease smoothly so that the expansion of the depletion layer increases gradually with the applied voltage. Recently, however, there have been demands for a variable-capacitance diode device which is designed such that a wide range of variation in the depletion layer width occurs with respect to the narrow range of variation in the applied voltage and sufficient tuning capacitance is available.

The conventional variable-capacitance diode device will now be described with reference to FIG. 1 wherein the abscissa represents the depth $X_i$ from the surface of the semiconductor substrate, and the ordinate indicate the impurity concentration C on a semi-logarithmic scale. In FIG. 1, the dotted curve (10) represents a semiconductor layer of the N+ conductivity type formed through a thermal diffusion of the impurity; and the solid curve (11) indicates a semiconductor layer of the P+ conductivity type. A PN junction J is defined between the N+ and P+ type semiconductor layers. Thus, the impurity concentration in the semiconductor layer of the N+ conductivity type as indicated by the curve (12) decreases smoothly except for the PN junction J, and it is usual that the concentration curve (12) represents a concentration profile in the form of Gaussian distribution which is proximate to the curve (10). Alternatively, the arrangement is made such that the impurity concentration decreases in steps along a curve corresponding to the Gaussian distribution and the width of the depletion layer expands with an increase in the voltage applied across the PN junction. In FIG. 1, the region indicated at (13) corresponds to an epitaxial layer, and the region shown at (14) corresponds to substrate.

However, it will be seen that the profile of impurity concentration in the N+ conductivity type semiconductor layer (indicated by the curve (12)), except in the proximity to the PN junction J, is such that the following relationship holds:

$$A_i > A_{i+1}$$

on the assumption that the impurity concentration at the highest point of the curve is $A_1$, and those at sequential points are $A_2, A_3, \ldots, A_i, A_{i+1}, \ldots$ respectively. The profile of impurity concentration in the region $A_1, A_2,$ $A_3$ appears approximate to the Gaussian distribution, and tends to swell out. Such swelling will be described with reference to FIG. 2 which illustrates the relationship between the applied voltage and the capacitance on semi-logarithmic scale.

As shown at (I) in FIG. 2, the relationship between the applied voltage and the capacitance varies along a curve resembling inverted S-shape corresponding to the profile of impurity concentration, instead of changing linearly from the maximum impurity concentration $C_{max}$ to the minimum impurity concentration $C_{min}$. Thus, when the voltage range over which the capacitance is usable as tuning capacitance is wide, sufficient tuning capacitance is available, and critical problems are relatively less likely to arise. In contrast thereto, when it is desired that a variable-capacitance diode device having a similar construction to that of the prior art be operated with an applied voltage as low as 1 or 2 V, i.e., when it is attempted to make use of tuning capacitance occurring over a narrow voltage range as shown at (II) in FIG. 2, such a disadvantage that sufficient capacitance variation is not available, and thus the conventional device needs to be improved in this respect.

SUMMARY OF THE INVENTION

The present invention has been made with a view to eliminating the problems such as mentioned above.

It is a primary object of this invention to provide a variable-capacitance diode device which is so designed that sufficient tuning capacitance is available even with a low voltage.

Another object of this invention is to provide a variable-capacitance diode device which is designed so that the capacitance is varied substantially linearly with applied voltage on a semi-logarithmic scale.

Still another object of this invention is to provide a variable-capacitance diode device having such a construction that the impurity concentration at a predetermined depth can be reduced.

The present invention relates to a variable-capacitance diode device which is usable as a tuning element with an electronic tuning circuit. More particularly, the present invention provides a variable-capacitance diode device including a semiconductor layer of a first conductivity type wherein a high impurity concentration decreases gradually as the depth from the PN junction increases, and wherein the profile of impurity concentration in the semiconductor layer of the first conductivity type is such that at least one point where the following relation holds, occurs in the semiconductor layer of the first conductivity type:

$$A_i \leq A_{i+1} \ (i=1,2,\ldots,n)$$

on the assumption that the impurity concentration in terms of the distance $X_i$ depth-wise of the PN junction except in the vicinity of the PN junction is $A_i$, thereby making it possible to achieve high capacitance with a variation in the applied voltage.

Other objects, features and advantages of the present invention will become apparent from the ensuring description taken in conjunction with the accompanying drawings.

DESCRIPTION OF THE PREFERRED EMBODIMENTS

Figure 1:
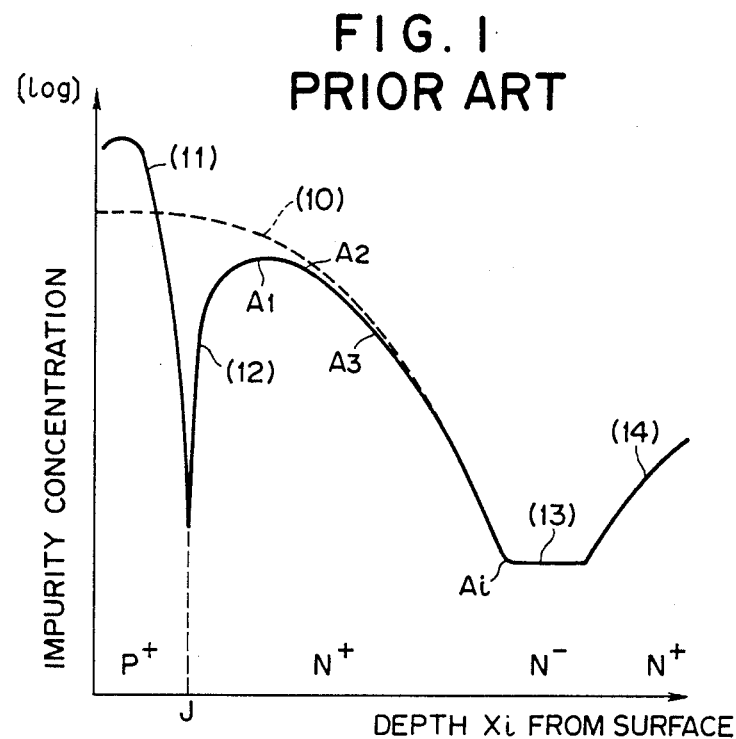
FIG. 1 illustrates the impurity concentration profile of a conventional variable-capacitance diode device.
Figure 2:
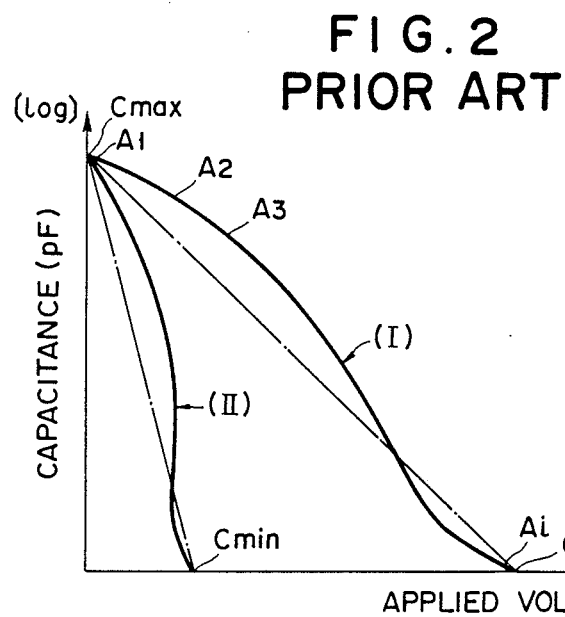
FIG. 2 is a view useful for explaining the relationship between applied voltage and capacitance.
Figure 3:
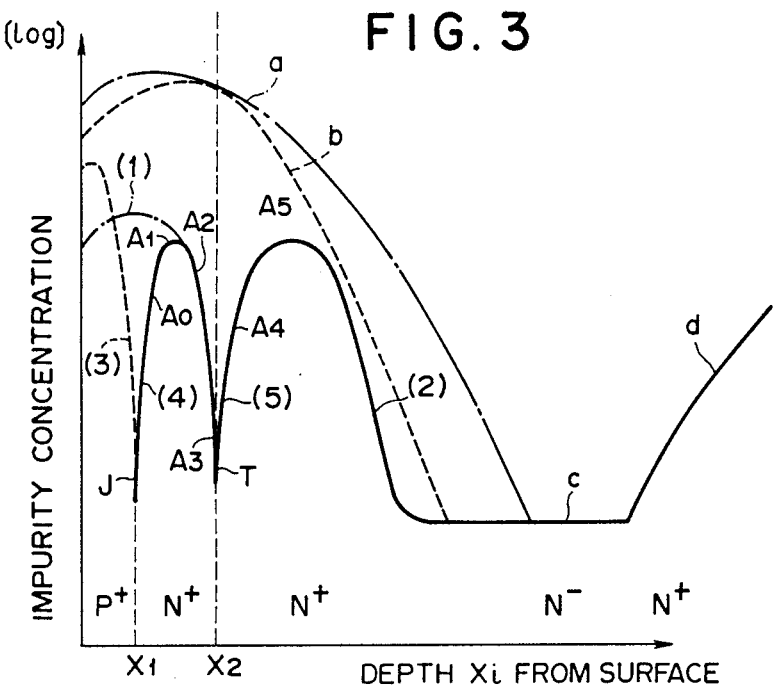
FIG. 3 illustrates the impurity concentration profile of the variable-capacitance diode device according to an embodiment of this invention.

Referring to FIG. 3, there is illustrated the profile of impurity concentration of the variable-capacitance diode device according to an embodiment of the present invention, wherein the abscissa indicates the depth $X_i$ from the surface of the semiconductor substrate, and the ordinate shows the impurity concentration C on a logarithmic scale.

As illustrated in FIG. 3, the variable-capacitance diode device according to this invention includes a PN junction J which is defined at a depth $X_1$ from the surface of the semiconductor substrate by a P+ conductivity type semiconductor layer in which the impurity concentration is distributed as shown by the curve (3), and an N+ conductivity type semiconductor layer in which the impurity concentration is distributed as shown by the curves (4) and (5); and a point at a depth $X_2$ from the surface of the semiconductor substrate where a low donor concentration of the N+ conductivity type semiconductor layer occurs, i.e., so-called inflection point T.

The capacitance C of the PN junction is related to the depletion layer width W and the area S of the PN junction as follows:

$$C = \epsilon S / W \quad (1)$$

where $\epsilon$ is the product of the relative dielectric constant of silicon and the dielectric constant of a vacuum, i.e., it is equal to $1.062 \times 10^{-8}$.

To decrease the capacitance C, on the other hand, it will be seen from Equation (1) that it is only necessary to increase the depletion layer width on the assumption that the area S of the PN junction is constant. Furthermore, the following equation holds true with respect to the depletion layer width:

$$W = K \left[ \frac{2\epsilon(V + \Phi)}{e} \left( \frac{1}{N_A} + \frac{1}{N_D} \right) \right]^{\frac{1}{2}}$$

where
- K = Factor of proportionality
- $N_A$ = Acceptor concentration
- $N_D$ = Donor concentration
- V = Applied voltage
- $\Phi$ = Diffusion potential
- e = Electron charge ($1.60 \times 10^{-19}$C)

Since the acceptor concentration $N_A$ is much higher than the donor concentration $N_D$, i.e., $N_A >> N_D$, the following equation holds:

$$W = K \left[ \frac{2\epsilon(V + \Phi)}{e N_D} \right]^{\frac{1}{2}} \quad (2)$$

Thus, to increase the depletion layer width W, it will be seen from Equation (2) that it is only necessary to decrease the donor concentration $N_D$ on the assumption that the applied voltage remains unchanged. In other words, it is only required that a region with a lower donor concentration be established in the N+ conductivity type semiconductor layer at the depth $X_i$ as measured from the surface of the semiconductor substrate.

The variable-capacitance diode device of this invention is constructed on the basis of the above-mentioned concept, wherein the PN junction J is defined, at the depth $X_1$ from the surface of the semiconductor substrate, between the P+ conductivity type semiconductor layer with such an impurity concentration profile as shown by the dotted curve (3) and the N+ conductivity type semiconductor layer with such impurity concentration profiles as shown by the curves (4) and (5). The N+ conductivity type semiconductor layer represented by the curves (1) and (2) is arranged such that the inflection point T of the impurity concentration profile occurs at the depth of $X_2$ as measured from the surface of the semiconductor substrate. More specifically, according to the present invention, the donor concentration is decreased by providing the inflection point T in the region $A_1$, $A_2$, $A_3$ where swelling of the impurity concentration profile occurs.

Description will now be made of the formation of the N+ conductivity type semiconductor layers having such impurity concentration profiles as shown by the curves (1) and (2) in FIG. 3 respectively.

First, an N+ conductivity type semiconductor layer having such an impurity concentration profile as shown by a chain line (a) is formed through thermal diffusion or the like; and a P+ conductivity type semiconductor layer having such an impurity concentration profile as shown by a dotted line (b) is formed through thermal diffusion or the like. These two semiconductor layers are arranged such that the impurity concentrations along the curves (a) and (b) become equal or close to each other at a depth of $X_2$ from the surface of the semiconductor substrate and the P+ conductivity type impurity concentration along the curve (b) never becomes higher than the N+ impurity concentration along the curve (a) at any point that is $X_i$ deep from the surface of the semiconductor substrate. Charges in the semiconductor layers represented by the curves (a) and (b) are provided by impurity elements which are opposite in charge polarity to each other; thus, a quantity of charges of the N+ conductivity type impurity element as represented by the curve (a) tend to be cancelled out with the same quantity of charges of the P+ conductivity type impurity element as represented by the curve (b). In this case, however, since the N+ conductivity type impurity concentration along the curve (a) is higher than the P+ conductivity type impurity concentration along the curve (b), charges in the semiconductor layers represented by the curves (a) and (b) turn out to be of the N+ conductivity type. In the region (or at any point) that is $X_2$ deep from the surface of the semiconductor substrate, the impurity concentrations along the curves (a) and (b) are set up to be equal to each other so that the N+ and P+ conductivity type impurity charges are cancelled out each other and thus the quantity of charges in that region turns out to be substantially equal to the quantity of charges which exist inherently in the semiconductor substrate. Alternatively, the N+ conductivity type semiconductor layer may dominate to some extent, without being cancelled out as mentioned just above. At any point at the depth of $X_i$ as measured from the surface of the semiconductor substrate, however, the P+ conductivity type impurity concentration never exceeds the N+ conductivity type impurity concentration. It is not necessarily required that the impurity concentrations at the depth of $X_2$ be equal to each other; rather, it is simply required that the P+ conductivity type diffusion layer be formed in such a manner that the impurity concentration thereof turns out to be close to that of the N+ conductivity type one at the depth of $X_2$, as measured from the surface of the semiconductor substrate.

Referring again to FIG. 3, the curve (c) represents the profile of impurity concentration intrinsic in the epitaxial layer formed in the semiconductor substrate, and the curve (d) indicates the profile of impurity concentration of the semiconductor substrate. Although the epitaxial layer and substrate layer formed in the bottom portion of the semiconductor substrate include an inflection point of the N+ conductivity type impurity concentration, such an inflection point may be disregarded since the depletion layer simply extends short of those layers.

The variable-capacitance diode device according to this invention is arranged such that the impurity concentration profiles as represented by the curves (4) and (5) include a region in which the following relationship holds:

$$A_i \leq A_{i+1} \ (i=1, 2, \ldots, n) \quad (3)$$

on the assumption that the N+ conductivity type impurity concentration in the vicinity of the PN junction J is $A_O$; the maximum peak of the impurity concentration profile represented by the curve (4) is $A_1$; and the impurity concentrations at points scattered in the direction of depth $X_i$ are $A_2, A_3, \ldots, A_i$ respectively. In other words, the variable-capacitance diode device according to this invention is arranged such that there occurs at least one point where the above-mentioned expression (3) holds true, except for the inflection points in the vicinity of the PN junction and in the portion of the epitaxial layer and substrate area. The region $A_3, A_4, A_5$ in FIG. 3 is the region where the foregoing expression (3) holds true.

Figure 5:
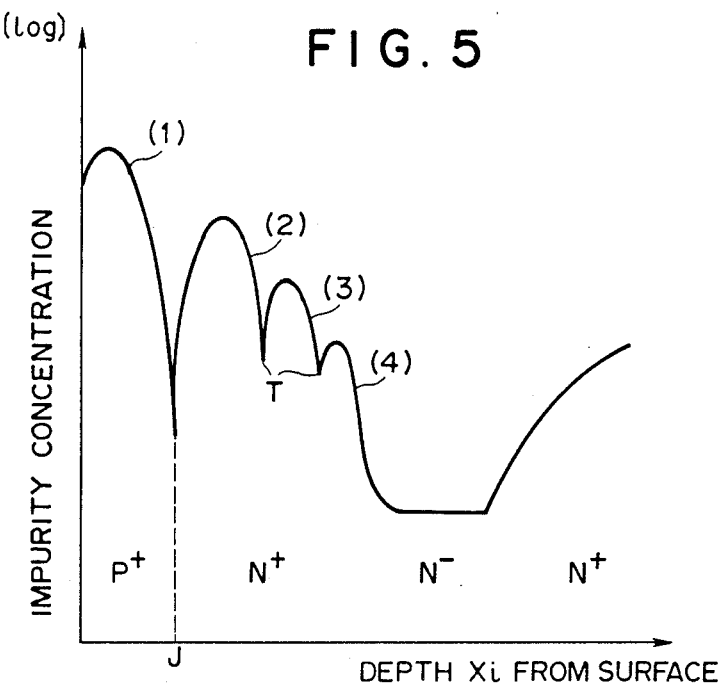
FIGS. 5 and 6 illustrate impurity concentration profiles of the variable-capacitance diode devices according to other embodiments of the present invention.

Referring to FIG. 5, there is illustrated another embodiment of the present invention which includes an N+ conductivity type semiconductor layer having such impurity concentration profiles as represented by curves (2), (3), (4) wherein more than one inflection point T occur at points each having a predetermined depth as measured from the surface of the semiconductor substrate.

Figure 6:
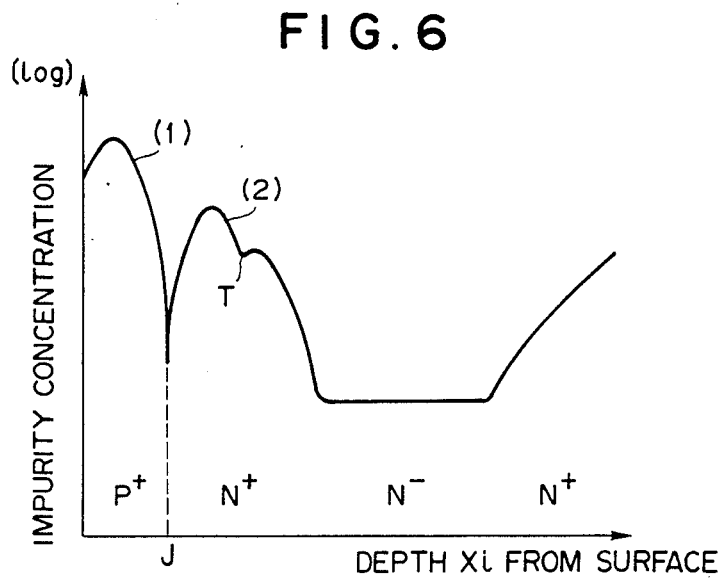

Referring to FIG. 6, there is illustrated still another embodiment of the present invention which includes a gentle inflection point T, as opposed to the embodiment described above in connection with FIG. 3 wherein the impurity concentration profile of the N+ conductivity type semiconductor layer changes very sharply as indicated at $A_1, A_2, A_3, \ldots, A_i$. It goes without saying that this embodiment is also arranged such that the profile of impurity concentration varies so as to satisfy the requirement as defined by the above-mentioned expression (3).

Figure 4:
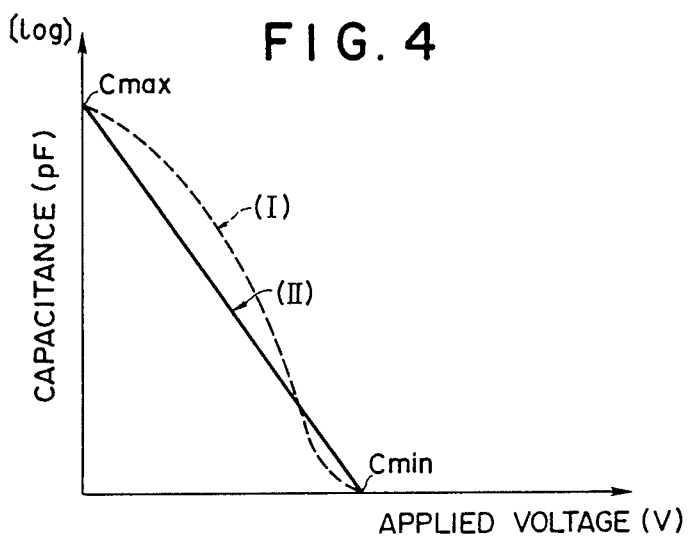
FIG. 4 is a view useful for explaining the relationship between applied voltage and capacitance in the device shown in FIG. 3.

With the construction of the variable-capacitance diode device according to this invention which has such profiles of impurity concentration as shown in FIG. 3, the relationship between applied voltage and capacitance turns out to be substantially linear as shown at (II) in FIG. 4 so that sufficient tuning capacitance can be achieved even with application of as low a voltage as about 1 to 2 V, as opposed to the prior art wherein the curve representing the relationship between applied voltage and capacitance swells out in the form of inverted S-shape as shown at (I) in FIG. 4.

As will be appreciated from the foregoing discussion, according to the present invention, there is provided a variable-capacitance diode device wherein a region or point where the donor concentration is decreased, is provided in that portion of the N+ conductivity type semiconductor layer in the vicinity of the PN junction. Such a variable-capacitance diode device is advantageous in that a wide range of capacitance can be achieved even with application of a voltage as low as 1 to 2 V for example; the capacitance is varied with the applied voltage substantially linearly on logarithmic scale, which facilitates handling of the device; and sufficient tuning capacitance is achieved.

A further advantage is that the variable-capacitance diode device of this invention has such a construction as to make it easy to form a low impurity concentration region at a predetermined depth.

While the present invention has been illustrated and described with respect some specific embodiment thereof, it is to be understood that the present invention is by no means limited thereto but encompasses all changes and modifications which will become possible within the scope of the appended claims.

I claim:

1. A variable-capacitance diode device including a PN junction, and a semiconductor layer of a first conductivity type, the impurity concentration of which decreases with increasing depth from the PN junction, characterized in that except in the vicinity of the PN junction, said semiconductor layer of the first conductivity type formed through superimposition of first and second conductivity type impurity elements includes at least one point where said first conductivity type impurity element is close in concentration to said second conductivity type impurity element and the following relationship holds true:

$$A_i \leq A_{i+1} \ (i=1, 2, \ldots, n)$$

where $A_i$ represents impurity concentration of said semiconductor layer of the first conductivity type at a distance $X_i$ as viewed depth-wise of the PN junction.

* * * * *